(12) United States Patent
Sato

(10) Patent No.: US 11,562,970 B2
(45) Date of Patent: Jan. 24, 2023

(54) SEMICONDUCTOR DEVICE AND MANUFACTURING METHOD THEREOF

(71) Applicant: FUJI ELECTRIC CO., LTD., Kawasaki (JP)

(72) Inventor: Tadahiko Sato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 127 days.

(21) Appl. No.: 17/212,084

(22) Filed: Mar. 25, 2021

(65) Prior Publication Data

US 2021/0358869 A1 Nov. 18, 2021

(30) Foreign Application Priority Data

May 15, 2020 (JP) .............. JP2020-085678

(51) Int. Cl.
  *H01L 23/00* (2006.01)
  *H01L 23/055* (2006.01)
  *H01L 25/065* (2006.01)
  *H01L 25/18* (2006.01)
  *H05K 1/18* (2006.01)

(52) U.S. Cl.
  CPC .......... *H01L 23/564* (2013.01); *H01L 23/055* (2013.01); *H01L 25/0655* (2013.01); *H01L 25/18* (2013.01); *H05K 1/184* (2013.01); *H05K 2201/09063* (2013.01); *H05K 2201/10166* (2013.01); *H05K 2201/10174* (2013.01); *H05K 2201/10568* (2013.01); *H05K 2201/10704* (2013.01)

(58) Field of Classification Search
  CPC . H01L 23/564; H01L 23/055; H01L 25/0655; H01L 25/18; H05K 1/184; H05K 2201/09063; H05K 2201/10166; H05K 2201/10174; H05K 2201/10568; H05K 2201/10704
  See application file for complete search history.

(56) References Cited

U.S. PATENT DOCUMENTS

2012/0320545 A1* 12/2012 Lo Presti ............. H05K 7/1432
                                                          361/752
2018/0338376 A1    11/2018 Terashima

FOREIGN PATENT DOCUMENTS

| JP | H08-007956 A | 1/1996 |
|----|--------------|--------|
| JP | 3025083 U | 6/1996 |
| JP | 2009-066986 A | 4/2009 |

(Continued)

*Primary Examiner* — Peniel M Gumedzoe
(74) *Attorney, Agent, or Firm* — Rabin & Berdo, P.C.

(57) ABSTRACT

A semiconductor device, including a semiconductor module, a positioning member and a printed board. The semiconductor module includes a case that stores a semiconductor chip, a plurality of external terminals electrically connected to the semiconductor chip and extending upward from a front surface of the case, and a reference pin extending upward from the front surface of the case. The positioning member has a reference hole and a plurality of supporting holes penetrating therethrough. The printed board including a plurality of terminal holes that respectively correspond to the plurality of external terminals. The printed board is disposed on the front surface of the case via the positioning member. The plurality of external terminals of the semiconductor module are respectively attached to the plurality of terminal holes.

10 Claims, 18 Drawing Sheets

(56) References Cited

FOREIGN PATENT DOCUMENTS

| JP | 2011-187564 A | 9/2011 |
| JP | 2013-030591 A | 2/2013 |
| JP | 2018-195714 A | 12/2018 |

\* cited by examiner

SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2020-085678, filed on May 15, 2020, the entire contents of which are incorporated herein by reference.

BACKGROUND OF THE INVENTION

1. Field of the Invention

The embodiments discussed herein relate to a semiconductor device and a manufacturing method thereof.

2. Background of the Related Art

Semiconductor modules include semiconductor chips and are used as power conversion devices. These semiconductor chips are, for example, insulated gate bipolar transistors (IGBTs) or power metal-oxide-semiconductor field-effect transistors (MOSFETs). Such a semiconductor module includes at least a semiconductor chip, an external terminal, and a ceramic circuit board to which the semiconductor chip and the external terminal are connected. The ceramic circuit board includes a ceramic board and a circuit pattern formed on the ceramic board. The semiconductor chip is bonded to the circuit pattern via solder.

In addition, a semiconductor device includes the semiconductor module and a printed board electrically connected to the semiconductor module. An opening is formed in the printed board. The external terminal is inserted into the opening in the printed board and is electrically connected to the printed board. In this way, a control signal is inputted to the semiconductor module from the printed board via the external terminal (for example, see Japanese Laid-open Patent Publication No. 2018-195714).

In a step of manufacturing the semiconductor module, heating and cooling is performed. For example, the semiconductor chip is disposed on the circuit pattern via a solder plate. The solder plate is melted by heating first and is cooled next. The semiconductor chip is consequently bonded to the circuit pattern via the solder. In addition, to seal the semiconductor chip, resin is injected. The resin is cured after the whole device is heated and cooled.

However, different parts included in the semiconductor module have different thermal expansion coefficients. For this reason, the semiconductor module is deformed. In addition, the curing or contraction of the sealing resin, which is caused by the temperature change, could also deform the semiconductor module. If the semiconductor module is deformed, the external terminal extending from the semiconductor module is also shifted from its proper position. As a result, it becomes difficult to attach the printed board to the external terminal.

SUMMARY OF THE INVENTION

According to one aspect of the embodiments, there is provided a semiconductor device including a semiconductor module, including a semiconductor chip, a case which stores the semiconductor chip, the case having a front surface, a plurality of external terminals which are electrically connected to the semiconductor chip and extend upward from the front surface of the case, and a reference pin which extends upward from the front surface of the case; a positioning member having a front surface and a rear surface thereof that are opposite to each other, the rear surface facing the front surface of the case, the positioning member including a reference hole penetrating therethrough to accommodate the reference pin of the semiconductor module, and a plurality of supporting holes formed therein to respectively accommodate the plurality of external terminals of the semiconductor module; and a printed board including a plurality of terminal holes that respectively correspond to the plurality of external terminals, the printed board being disposed on the front surface of the case via the positioning member, the plurality of external terminals of the semiconductor module being respectively attached to the plurality of terminal holes.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 1 in FIG. 1, "front surface" and "top surface" each mean a surface corresponding to the near side of FIG. 1. Likewise, regarding the semiconductor device 1 in FIG. 1, "up" means the direction of the near side of FIG. 1. In addition, regarding the semiconductor device 1 in FIG. 1, "rear surface" and "bottom surface" each mean a surface corresponding to the far side of FIG. 1. Likewise, regarding the semiconductor device 1 in FIG. 1, "down" means the direction of the far side of FIG. 1. In the other drawings as well, the above terms mean their respective directions, as needed. The terms "front surface", "top surface", "up", "rear surface", "bottom surface", "down", and "side surface" are simply used as convenient expressions to determine relative positional relationships and are not intended to limit the technical concepts of the embodiments. For example, the terms "up" and "down" do not necessarily mean any vertical directions with respect to the ground. That is, the directions expressed by "up" and "down" are not limited to the directions relating to the gravitational force. In the present description, a planar view signifies a view seen from above the top surface of a semiconductor module.

First Embodiment

Figure 1:
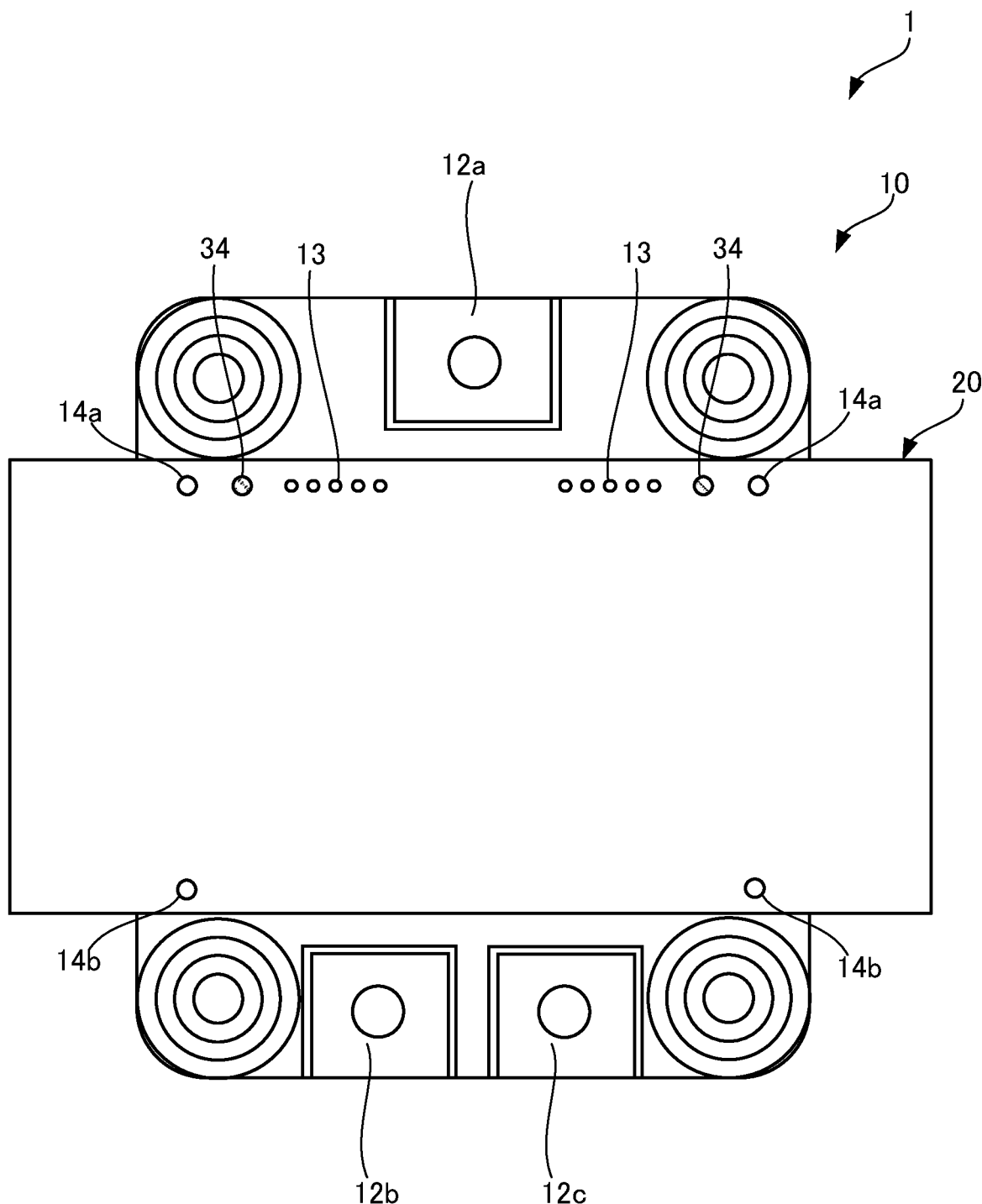
FIG. 1 is a plan view of a semiconductor device according to a first embodiment.
Figure 2:
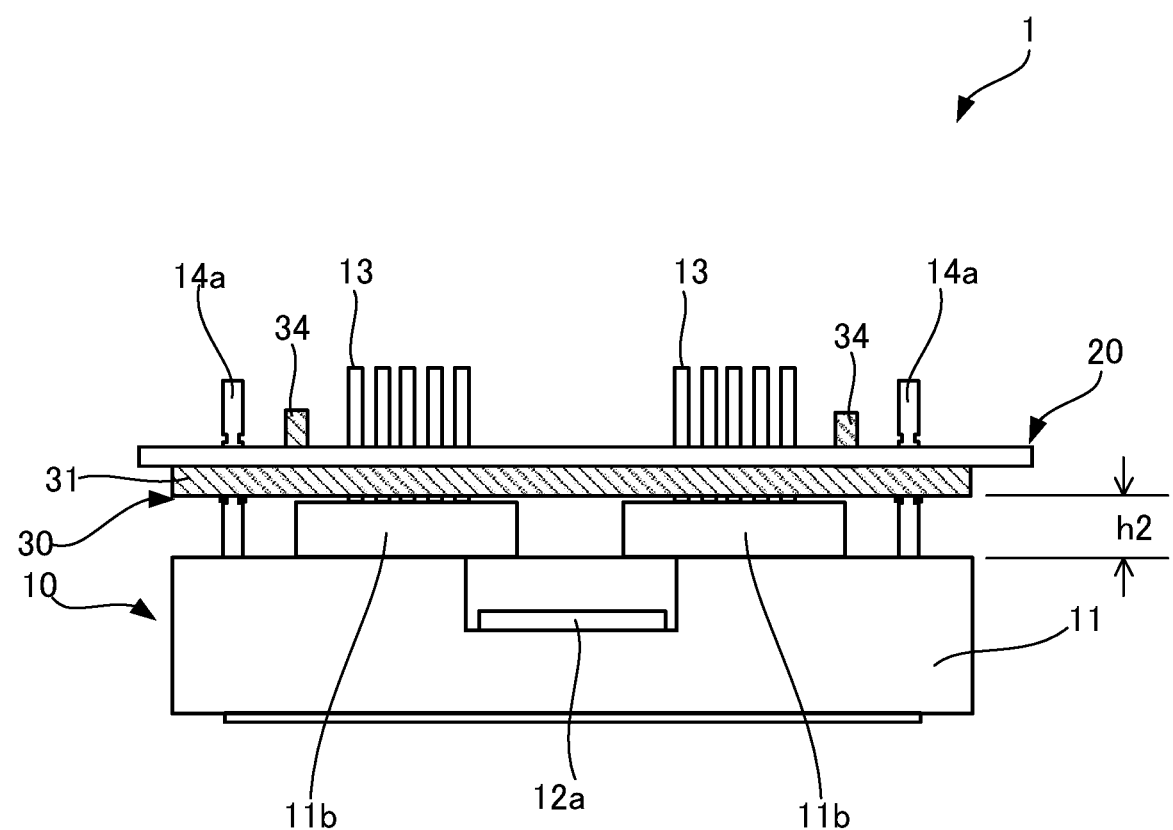
FIG. 2 is a side view of the semiconductor device according to the first embodiment.

A semiconductor module according to a first embodiment will be described with reference to FIGS. 1 and 2. FIG. 1 is a plan view of a semiconductor device according to the first embodiment, and FIG. 2 is a side view of the semiconductor device according to the first embodiment. Note that a plurality of components of the same type are collectively given the same reference character and will be described without distinction among them.

This semiconductor device 1 includes a semiconductor module 10, a printed board 20, and a positioning member 30. The semiconductor module 10 includes a case 11 that stores components. The case 11 has a front surface (a first front surface) on which electrode terminals 12a, 12b, and 12c, control terminals 13 (external terminals), and reference pins 14a and 14b are formed. The front surface may be a principal surface having a large area on the top surface of the case 11. The semiconductor module 10 will be described in detail below.

The printed board 20 includes terminal holes 22 and is electrically connected to the control terminals 13 that pass through and are attached to the terminal holes 22. In addition, each of the four reference pins 14a and 14b of the semiconductor module 10 passes through a corresponding one of the four corners of the printed board 20. In addition, positioning elements 34 of the positioning member 30 pass through the printed board 20. The printed board 20 will be described in detail below.

The positioning member 30 is placed between the semiconductor module 10 and the printed board 20. The positioning member 30 has a front surface (a second front surface) and a rear surface (a second rear surface), which is opposite to the front surface. The rear surface of the positioning member 30 faces the front surface of the case 11. The positioning elements 34 are formed on the front surface of the positioning member 30. The control terminals 13 and the reference pins 14a of the semiconductor module 10 pass through the positioning member 30. In addition, as described above, the positioning elements 34 of the positioning member 30 pass through the printed board 20. The positioning member 30 will be described in detail below.

Figure 3:
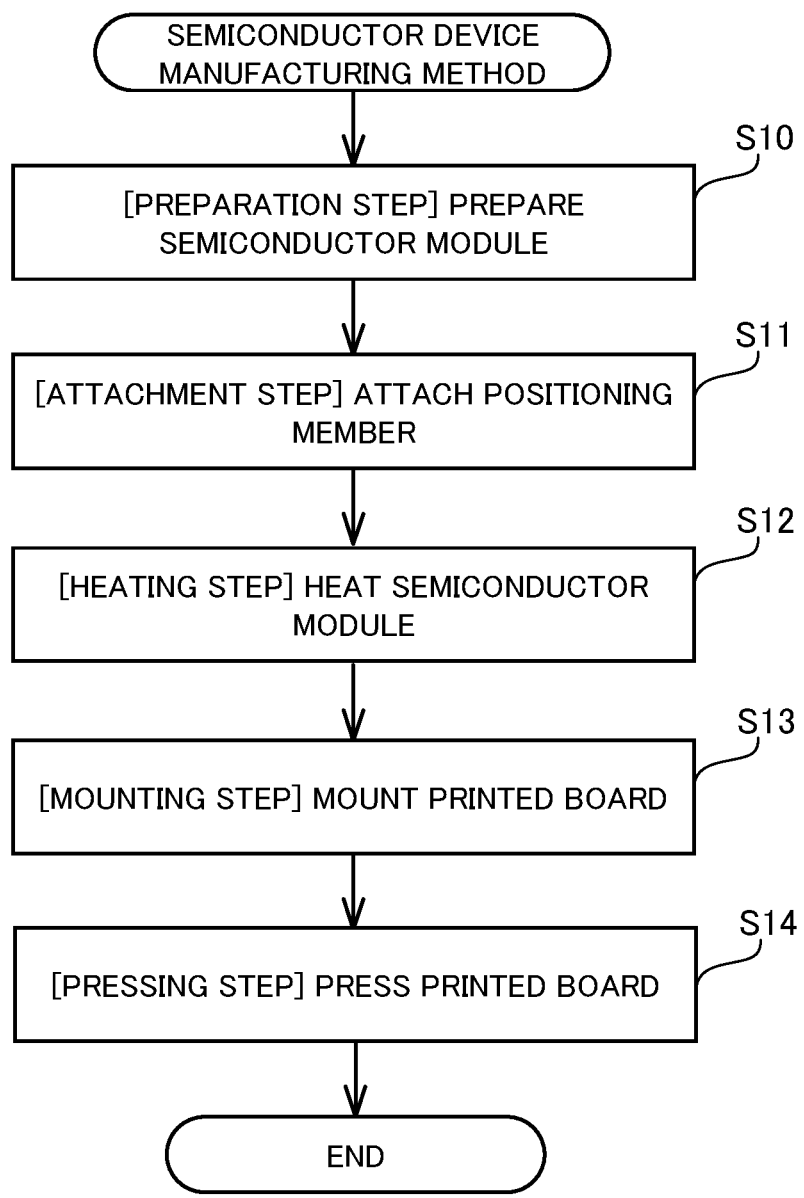
FIG. 3 is a flowchart illustrating a semiconductor device manufacturing method according to the first embodiment.
Figure 4:
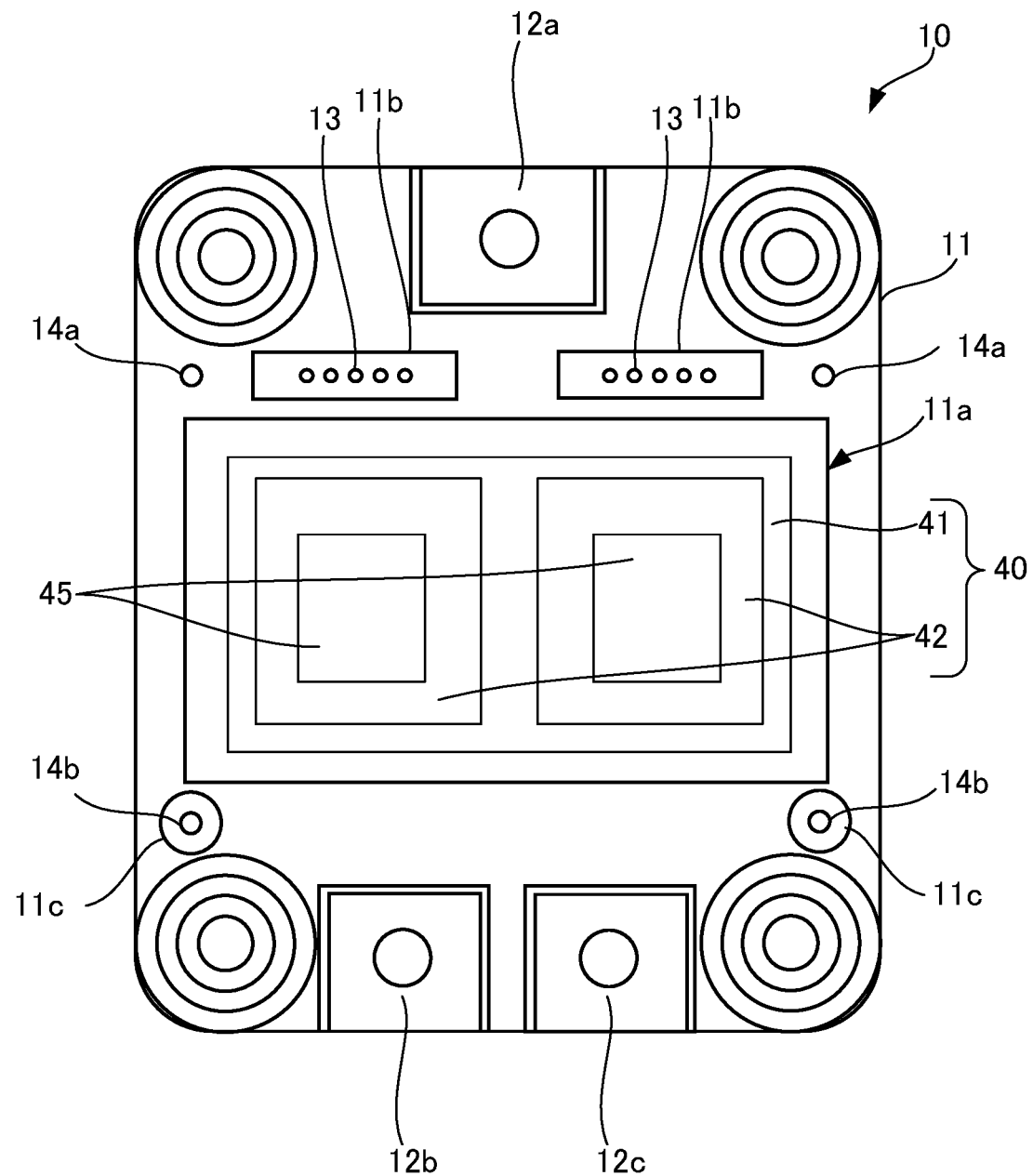
FIG. 4 is a plan view of a semiconductor module according to the first embodiment.

Next, a manufacturing method of the semiconductor device 1 will be described with reference to FIG. 3. FIG. 3 is a flowchart illustrating a semiconductor device manufacturing method according to the first embodiment. First, a preparation step of preparing the semiconductor module 10 is performed (step S10 in FIG. 3). The semiconductor module 10 prepared in this step will be described with reference to FIGS. 4 and 5. FIG. 4 is a plan view of the semiconductor module 10 according to the first embodiment, and FIG. 5 is a side view of the semiconductor module 10 according to the first embodiment.

Figure 5:
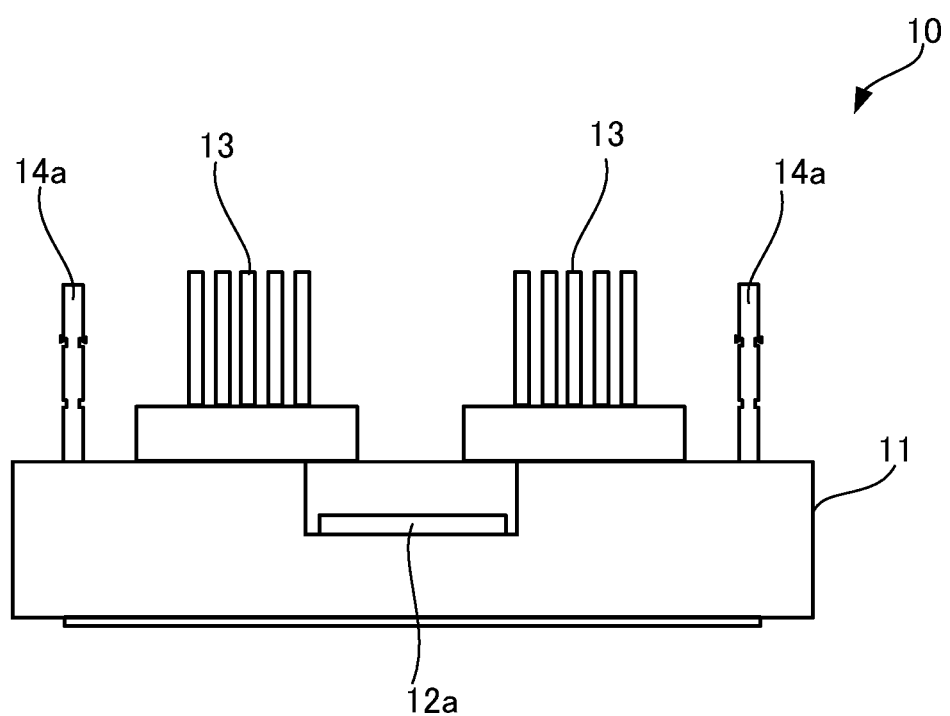
FIG. 5 is a side view of the semiconductor module according to the first embodiment.

As illustrated in FIGS. 4 and 5, the semiconductor module 10 has the case 11 integrally including an open storage part 11a, terminal protection parts 11b, and pin protection parts 11c. The case 11 has a rectangular shape in a planar view. The case 11 is a frame body, and the open storage part 11a is a rectangular open area in a planar view provided approximately in the middle of the front surface of the case 11. The open storage part 11a defines an area in which components are stored. The components in the open storage part 11a are sealed by sealing material 15. In this connection, in FIG. 4, the sealing material 15 sealing the open storage part 11a is not illustrated. The terminal protection parts 11b protrude by a predetermined height from two locations of the front surface of the case 11. The terminal protection parts 11b may have a rectangular shape in a planar view and may be arranged in a line. The plurality of control terminals 13 are arranged in the terminal protection parts 11b. The plurality of control terminals 13 may be arranged in a line, in a zigzag pattern, or in two lines. In addition, each of the plurality of control terminals 13 extends upward from a corresponding one of the terminal protection parts 11b on the front surface of the case 11. The plurality of control terminals 13 may be substantially orthogonal or substantially parallel on the front surface of the case 11. The plurality of control terminals 13 on one terminal protection part 11b are disposed away from the plurality of control terminals 13 on the other terminal protection part 11b. The lower parts of the plurality of control terminals 13 are protected by their respective terminal protection parts 11b. The pin protection parts 11c are formed at the lower outer corners of the open storage part 11a in FIG. 4 and protrude by a predetermined height from the front surface of the case 11. The pin protection parts 11c each have a circular shape in a planar view. The reference pins 14b extend upward from the pin protection parts 11c on the front surface of the case 11. The lower parts of the reference pins 14b are also protected by their respective pin protection parts 11c. The front surface of the case 11 is also provided with the electrode terminals 12a, 12b, and 12c. At this point, as will be described below, the case 11 is attached to a ceramic circuit board 40 only via adhesive, which has not been cured yet.

For example, the components stored in the open storage part 11a of the case 11 realize a single-phase inverter circuit. As illustrated in FIG. 4, for example, these components include the ceramic circuit board 40 and semiconductor chips 45 bonded to the front surface of the ceramic circuit board 40 via bonding material. The ceramic circuit board 40 and the semiconductor chips 45 are electrically connected to each other via bonding wires (not illustrated), as needed.

The ceramic circuit board 40 has a rectangular shape in a planar view. The ceramic circuit board 40 includes a ceramic board 41, a metal plate (not illustrated) formed on the rear surface of the ceramic board 41, and a plurality of circuit patterns 42 formed on the front surface of the ceramic board 41. The ceramic board 41 and the metal plate each have a rectangular shape in a planar view. The ceramic board 41 is made of ceramic material having good thermal conductivity. For example, the ceramic material is composite material containing aluminum oxide and zirconium oxide added to the aluminum oxide as its principal components. Alternatively, the ceramic material is material containing silicon nitride or aluminum nitride as its principal component. The thickness of the ceramic board 41 is between 0.5 mm and 2.0 mm, inclusive. The metal plate is made of metal material having excellent thermal conductivity. The metal material is, for example, aluminum, iron, silver, copper, or an alloy containing at least one kind of these elements. The thickness of the metal plate is between 0.1 mm and 2.0 mm, inclusive. To improve the corrosion resistance, plating may be performed on the front surface of the metal plate. The plating material used in this plating is, for example, nickel, a nickel-phosphorus alloy, or a nickel-boron alloy.

The plurality of circuit patterns 42 are made of metal material having excellent electrical conductivity. Examples of the metal material include silver, copper, nickel, and an alloy containing at least one kind of these elements. The individual circuit pattern 42 has a thickness between 0.5 mm and 1.5 mm, inclusive. To improve the corrosion resistance, plating may be performed on the front surface of the individual circuit pattern 42. The plating material used in this plating is, for example, nickel, a nickel-phosphorus alloy, or a nickel-boron alloy. The plurality of circuit patterns 42 are formed on the ceramic board 41 by forming a metal layer on the front surface of the ceramic board 41 and performing etching or the like on this metal layer. Alternatively, a plurality of circuit patterns 42, which have previously been cut out from a metal layer, may be press-bonded to the front surface of the ceramic board 41. The number of circuit patterns 42 and the shapes and the sizes of the circuit patterns 42 may be suitably set. For example, a direct copper bonding (DCB) board or an active metal brazed (AMB) board may be used as the ceramic circuit board 40.

The individual semiconductor chip 45 includes a switching element formed on a silicon substrate or a silicon carbide substrate. The switching element is, for example, a vertical element such as an IGBT or a power MOSFET. If an IGBT is used for the semiconductor chip, the semiconductor chip includes a collector electrode as a main electrode on the rear surface and a gate electrode and an emitter electrode as a main electrode on the front surface. If a power MOSFET is used for the semiconductor chip 45, the semiconductor chip 45 includes a drain electrode as a main electrode on the rear surface and a gate electrode and a source electrode as a main electrode on the front surface. The gate electrode of the individual semiconductor chip 45 is electrically connected to a corresponding one of the plurality of control terminals 13. The semiconductor module 10 may include different semiconductor chips. A different semiconductor chip may include a diode element formed on a silicon substrate or a silicon carbide substrate. The diode element is, for example, a freewheeling diode (FWD) such as a Schottky barrier diode (SBD) or a P-intrinsic-N (PiN) diode. The individual different semiconductor chip includes a cathode electrode as a main electrode on the rear surface and an anode as a main electrode on the front surface. Alternatively, a semiconductor chip 45 may be a reverse conducting IGBT (RC-IGBT) including a switching element and a diode element on a single substrate.

The rear surfaces of these semiconductor chips 45 are bonded to predetermined circuit patterns via solder (not illustrated). Lead-free solder is used as the solder. For example, the lead-free solder has, as a main component, at least one of an alloy of tin, silver, and copper, an alloy of tin, zinc, and bismuth, an alloy of tin and copper, and an alloy of tin, silver, indium, and bismuth. The solder may contain additive, examples of which include nickel, germanium, cobalt, and silicon. Such addition of additive to the solder improves the wettability, the luster, and the bonding strength, and as a result, the reliability is improved. For example, these semiconductor chips each have a thickness between 180 μm and 220 μm, inclusive. The average thickness is about 200 μm.

These semiconductor chips 45 or these semiconductor chips 45 and circuit patterns 42 may be electrically connected to each other via wires (not illustrated). These wires are made of material having excellent electrical conductivity. Examples of this material include gold, silver, copper, aluminum, and an alloy containing at least one kind of these elements. For example, each of the wires has a diameter between 110 μm and 200 μm, inclusive. For example, each of the wires has a diameter between 350 μm and 500 μm, inclusive. In place of these wires, conductive plates may be used to achieve the electrical connection.

The ceramic circuit board 40 on which the semiconductor chips 45 are disposed is attached within the open storage part 11a of the case 11 via adhesive. At this point, the adhesive has not been cured yet. In addition, as illustrated in FIG. 4, the electrode terminal 12a is integrally formed on the middle of the (upper) side of the front surface of the case 11, and the electrode terminals 12b and 12c are also integrally formed on the (lower) side of the front surface of the case 11. In addition, the plurality of control terminals 13 are integrally formed in the two terminal protection parts 11b of the case 11. In addition, the reference pins 14a and 14b are integrally formed on the case 11. The reference pins 14b are integrally formed in their respective pin protection parts 11c. The case 11 is made of thermoplastic resin, examples of which include polyphenylene sulfide resin, polybutylene terephthalate resin, polybutylene succinate resin, polyamide resin, and acrylonitrile butadiene styrene resin. The case 11, including the electrode terminals 12a, 12b, and 12c, the control terminals 13 held in the terminal protection parts 11b, the reference pins 14a, and the reference pins 14b protected by the pin protection parts 11c, is formed by injection molding using thermoplastic resin.

Each of the electrode terminals 12a, 12b, and 12c may be a conductive plate having an end for connection. Each of the electrode terminals 12a, 12b, and 12c is electrically connected to a predetermined circuit pattern 42 of the ceramic circuit board 40 inside the case 11 via a wiring member. A positive terminal of a power supply is connected to the electrode terminal 12b, and a negative terminal of the power supply is connected to the electrode terminal 12c. An output is obtained from the electrode terminal 12a. Depending on the situation, bonding wires, lead frames, or bus bars are used as the wiring members.

Each of the plurality of control terminals 13 may be a conductive pin having an end for connection. The conductive pin may have a cylindrical or prismatic outer shape. The plurality of control terminals 13 are electrically connected to the gate electrodes of the semiconductor chips inside the case 11 via wiring members. Depending on the situation, bonding wires, lead frames, or bus bars are used as the wiring members.

The electrode terminals 12a, 12b, and 12c and the control terminals 13 are made of metal material having excellent electrical conductivity. Examples of the metal material include silver, copper, nickel, and an alloy containing at least one kind of these elements. To improve the corrosion resistance, plating may be performed on the front surface of each of the electrode terminals 12a, 12b, and 12c and the control terminals 13. The plating material used in this plating is, for example, nickel, a nickel-phosphorus alloy, or a nickel-boron alloy.

The reference pins 14a each have a cylindrical or prismatic shape. Each of the reference pins 14a has a plurality of grooves at predetermined parts along the outer periphery. In the present embodiment, an upper groove 14a1 is formed at an upper part of the individual reference pin 14a, and a lower groove 14a2 is formed at a lower part of the individual reference pin 14a. The reference pins 14a are formed at the upper outer corners of the open storage part 11a in FIG. 4. The reference pins 14a may be aligned with the plurality of control terminals 13. The plurality of control terminals 13 may be disposed between the two reference pins 14a in a planar view.

The reference pins 14b each have a cylindrical or prismatic shape. Unlike the reference pins 14a, the reference pins 14b may be formed without grooves. The reference pins 14b may be formed at the lower outer corners of the open storage part 11a in FIG. 4.

The reference pins 14a and 14b are not electrically connected to the semiconductor chips, etc. inside the case 11. Thus, the reference pins 14a and 14b may be made of material different from that of the electrode terminals 12a, 12b, and 12c and the control terminals 13.

The semiconductor module 10 is prepared by assembling these members. The positioning member 30 to be described below is also prepared.

Figure 6:
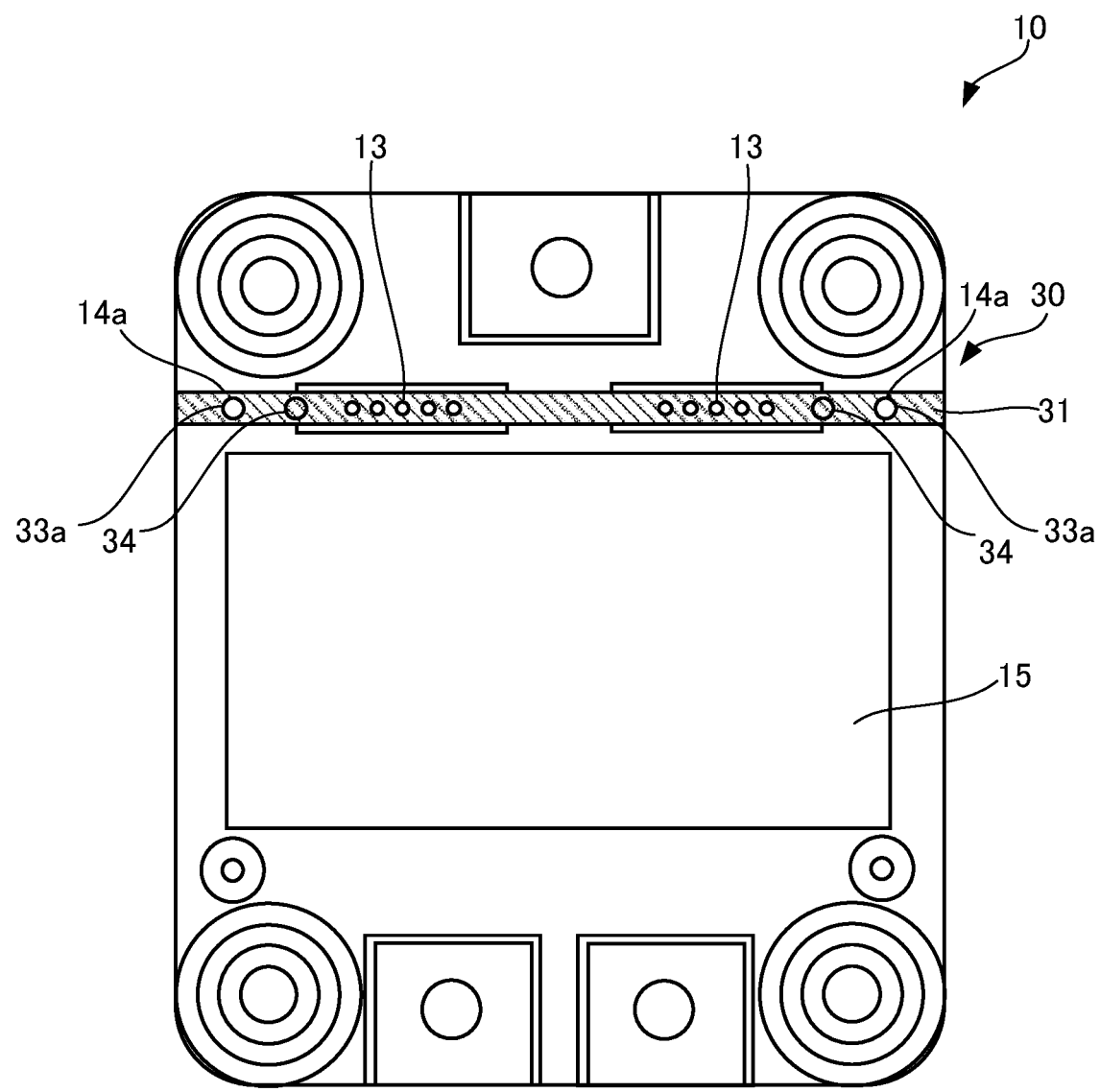
FIG. 6 is a plan view of the semiconductor module to which a positioning member according to the first embodiment has been attached.
Figure 7:
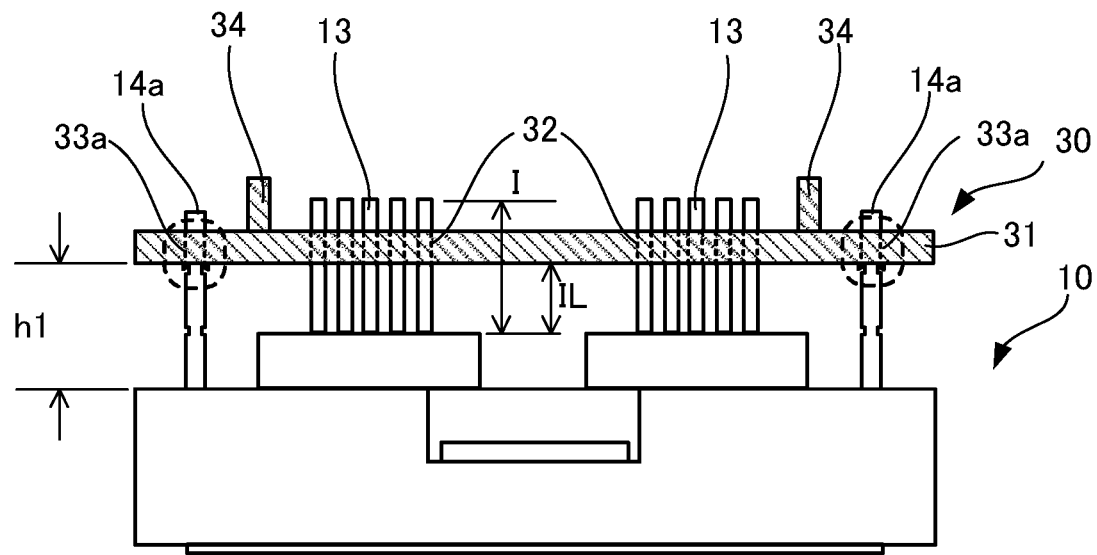
FIG. 7 is a first side view of the semiconductor module to which the positioning member according to the first embodiment has been attached.
Figure 8:
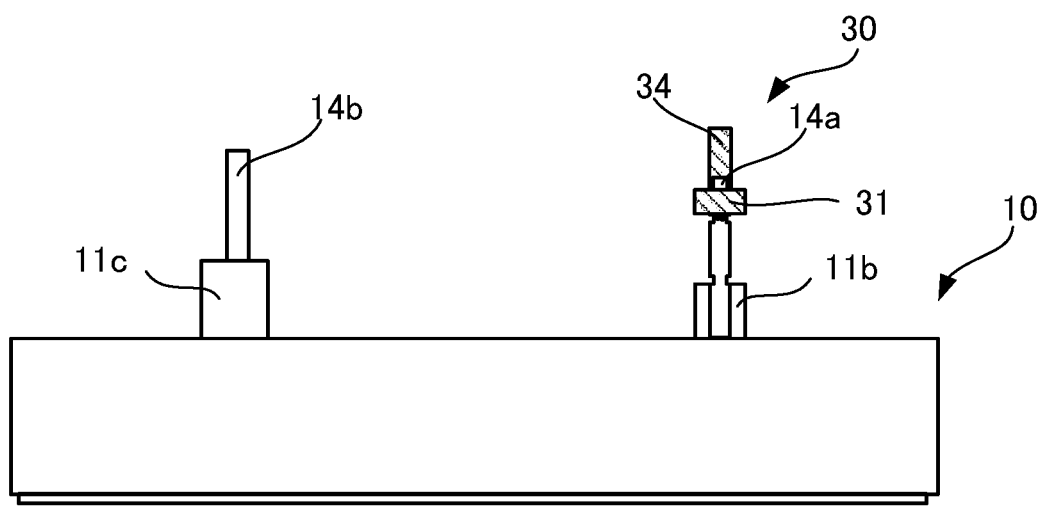
FIG. 8 is a second side view of the semiconductor module to which the positioning member according to the first embodiment has been attached.

Next, an attachment step of attaching the positioning member 30 to the semiconductor module 10 is performed (step S11 in FIG. 3). The positioning member 30 to be attached to the semiconductor module 10 will be described with reference to FIGS. 6 to 8. FIG. 6 is a plan view of the semiconductor module to which the positioning member according to the first embodiment has been attached. FIGS. 7 and 8 are side views of the semiconductor module to which the positioning member according to the first embodiment has been attached. FIG. 7 is a side view seen from the upper side in FIG. 6, and FIG. 8 is a side view seen from the right side in FIG. 6.

The positioning member 30 includes a supporting part 31 and the positioning elements 34, as illustrated in FIGS. 6 to 8. The supporting part 31 has a prismatic shape. For example, the supporting part 31 has a length, which matches the width of the case 11 of the semiconductor module 10. The supporting part 31 is located above the control terminals 13 and the reference pins 14a of the semiconductor module 10. In the present embodiment, since the control terminals 13 and the reference pins 14a are arranged linearly in a planar view, the supporting part 31 has a linear shape. Instead of being linearly arranged in a line, the plurality of control terminals 13 may be arranged in a zigzag pattern or in two lines. That is, the supporting part 31 may have a shape other than a linear shape, depending on the arrangement of the control terminals 13 and the reference pins 14a. In addition, the supporting part 31 includes supporting holes 32 and reference holes 33a. The supporting holes 32 pass through the front surface (the second front surface) of the supporting part 31 and the rear surface (the second rear surface), which is opposite to the front surface. The supporting holes 32 are formed at locations that correspond to the locations of the control terminals 13 of the semiconductor module 10. In addition, the number of supporting holes 32 is the same as the number of control terminals 13. Each of the supporting holes 32 has a diameter large enough to accommodate a control terminal 13. In addition, each of the supporting holes 32 may have a tapered part at the opening (a lower side in FIG. 7) into which a control terminal 13 is inserted. In this way, the control terminals 13 are easily inserted into their respective supporting holes 32. The plurality of supporting holes 32 may be arranged linearly, in a zigzag pattern, or in two lines, to correspond to the arrangement of the control terminals 13. Neighboring supporting holes 32 may be formed to communicate with each other, as long as the neighboring supporting holes 32 are able to hold their respective control terminals 13.

The reference holes 33a pass through the front surface of the supporting part 31 and the rear surface, which is opposite to the front surface. The reference holes 33a are formed at locations that correspond to the locations of their respective reference pins 14a of the semiconductor module 10. In addition, each of the reference holes 33a has a diameter large enough to accommodate a reference pin 14a. Each of the reference holes 33a has holding parts 33a1 for holding a reference pin 14a. These holding parts 33a1 make it possible to maintain the positioning member 30 at a predetermined height h1 of the reference pins 14a. The holding parts 33a1 will be described below.

The positioning elements 34 each have a cylindrical or prismatic rod shape. The length of the individual positioning element 34 is defined as described below. That is, when the positioning member 30 is attached to the semiconductor module 10, the upper ends of the positioning elements 34 are located higher than the upper ends of the control terminals 13 (see FIG. 7). After the positioning member 30 is attached to the semiconductor module 10, a length lL of the control terminals 13 from the rear surface of the positioning member 30 to the case 11 is ⅓ or more of an entire length l of the individual control terminal 13. In addition, when the printed board 20 is attached to the semiconductor module 10 (see FIG. 2), the upper ends of the positioning elements 34 are located lower than the upper ends of the control terminals 13. The positioning member 30 described above has thermal resistance and is made of material having a small thermal expansion coefficient. Examples of the material include carbon, glass, and ceramic material.

Figure 9:
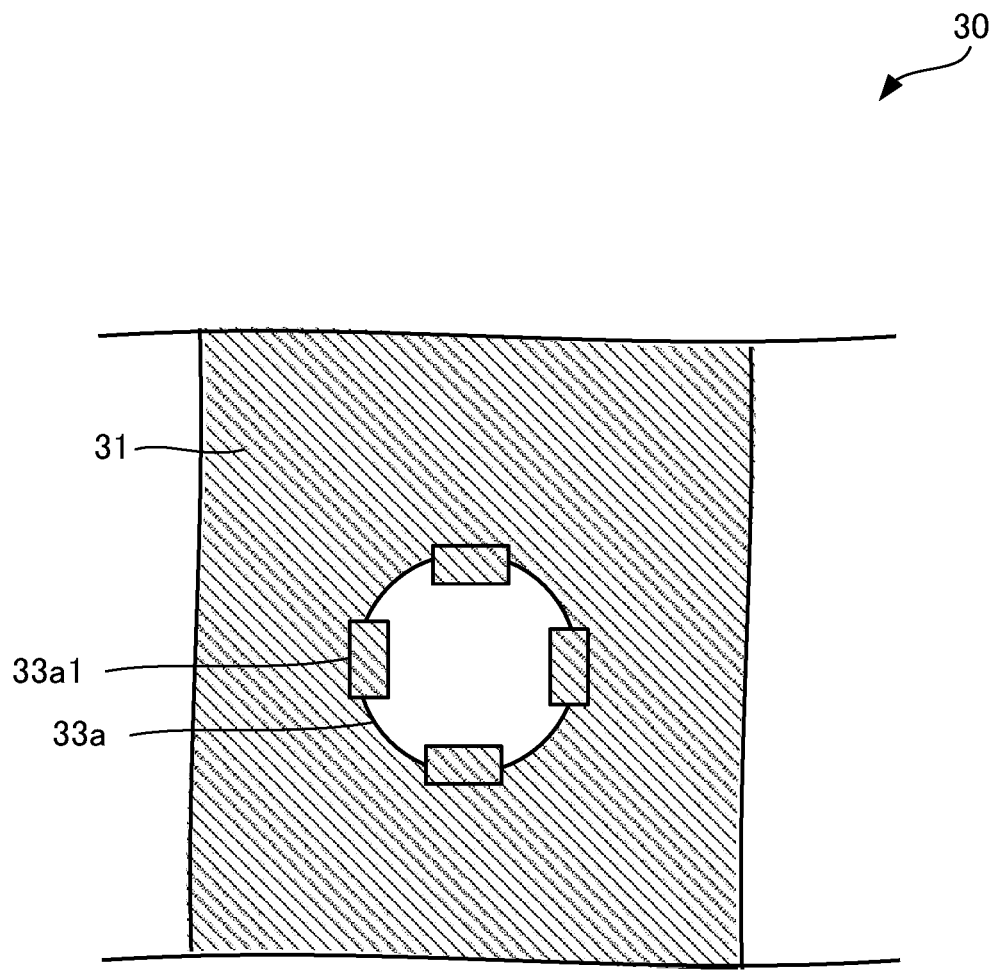
FIG. 9 is a plan view of a reference hole in the positioning member according to the first embodiment.

Next, the holding parts 33a1 of the reference holes 33a of the positioning member 30 will be described with reference to FIG. 9. FIG. 9 is a plan view of a reference hole of the positioning member according to the first embodiment. FIG. 9 illustrates the rear surface (facing the semiconductor module 10) of the positioning member 30. As illustrated in FIG. 9, holding parts 33a1 are formed around (the rear surface of) the individual reference hole 33a of the supporting part 31 of the positioning member 30. The individual holding part 33a1 extends downward along the open edge of the corresponding reference hole 33a and has a hook 33a2 whose end faces the corresponding reference hole 33a (see FIG. 10). The individual holding part 33a1 is formed along the open edge of a reference hole 33a. As will be described below, at least two holding parts 33a1 that face each other via a reference hole 33a are formed to hold a reference pin 14a. The present embodiment illustrates a case in which four holding parts 33a1 are formed along the open edge of a reference hole 33a. Alternatively, three holding parts 33a1 may be formed at equal intervals along the open edge of a reference hole 33a.

Figure 10:
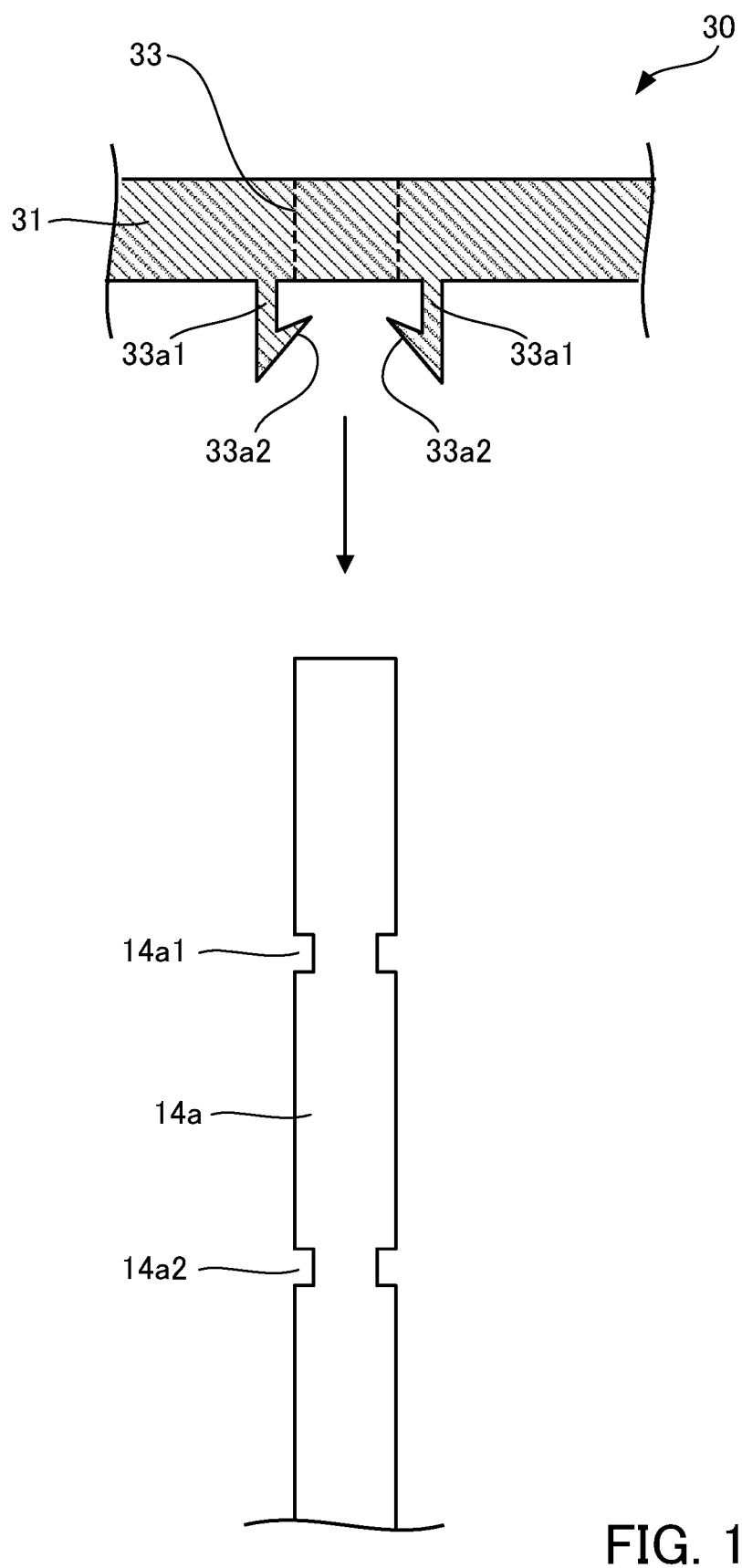
FIG. 10 is a first diagram illustrating an attachment step of the semiconductor device manufacturing method according to the first embodiment.
Figure 11:
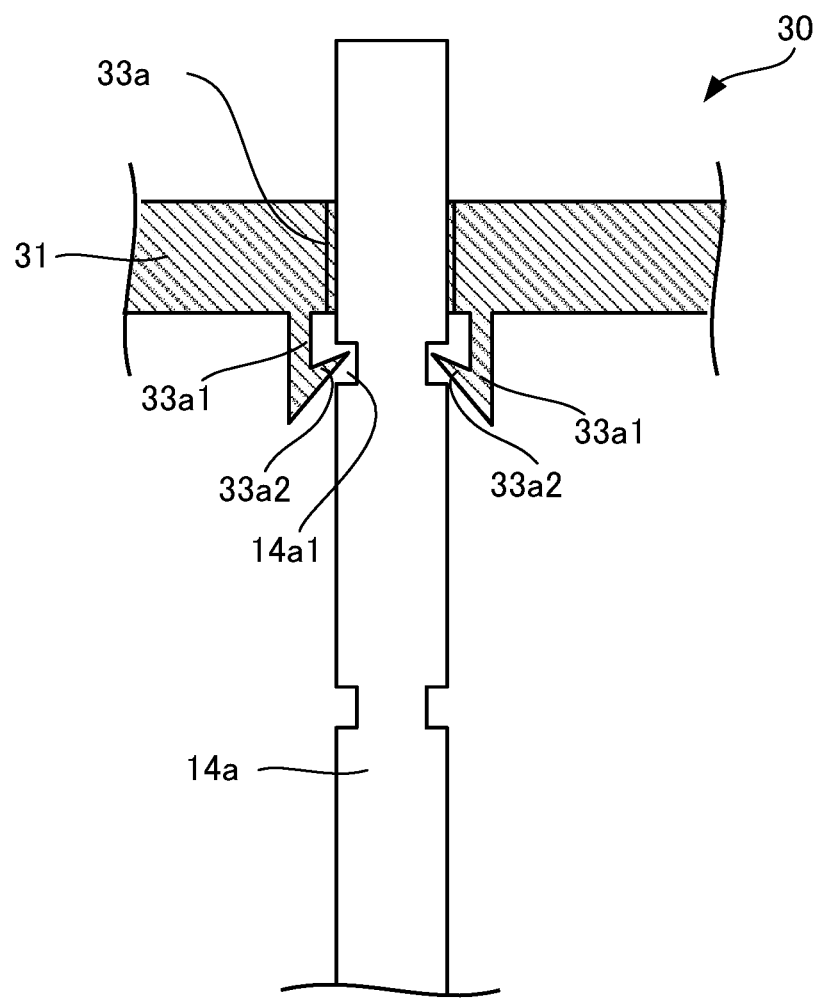
FIG. 11 is a second diagram illustrating the attachment step of the semiconductor device manufacturing method according to the first embodiment.

The effects of the holding parts 33a1 in the step of attaching the positioning member 30 to the semiconductor module 10 will be described with reference to FIGS. 10 and 11. FIGS. 10 and 11 illustrate the attachment step of the semiconductor device manufacturing method according to the first embodiment. First, the rear surface of the positioning member 30 is set to face the front surface of the semiconductor module 10. In addition, the supporting holes 32 of the positioning member 30 are positioned with respect to the control terminals 13 of the semiconductor module 10, and the reference holes 33a of the positioning member 30 are positioned with respect to the reference pins 14a of the semiconductor module 10. Next, the positioning member 30 is moved toward the front surface of the semiconductor module 10. Accordingly, the control terminals 13 come close to the supporting holes 32 (not illustrated), and the reference pins 14a come close to the reference holes 33a (FIG. 10).

When a reference pin 14a is inserted into a reference hole 33a, the hooks 33a2 of the holding parts 33a1 are locked with the upper groove 14a1 of the reference pin 14a, as illustrated in FIG. 11. The hooks 33a2 face the reference hole 33a. Thus, even if the positioning member 30 is moved farther from the semiconductor module 10 (upward in FIG. 11), since the hooks 33a2 are locked with the upper groove 14a1 of the reference pin 14a, the upward movement of the positioning member 30 is prevented. Thus, the positioning member 30 is maintained at the location of the upper groove 14a1 of the reference pin 14a (see FIG. 7). The rear surface of the positioning member 30 is maintained at the height h1 from the front surface of the case 11. When the positioning member 30 is moved toward the semiconductor module 10 (downward in FIG. 11), since the locking of the hooks 33a2 is released at the upper groove 14a1, the positioning member 30 is moved downward. Likewise, since the hooks 33a2 are locked with the lower groove 14a2 of the reference pin 14a, the positioning member 30 is maintained at the location of the lower groove 14a2 of the reference pin 14a (see FIG. 2).

Figure 12:
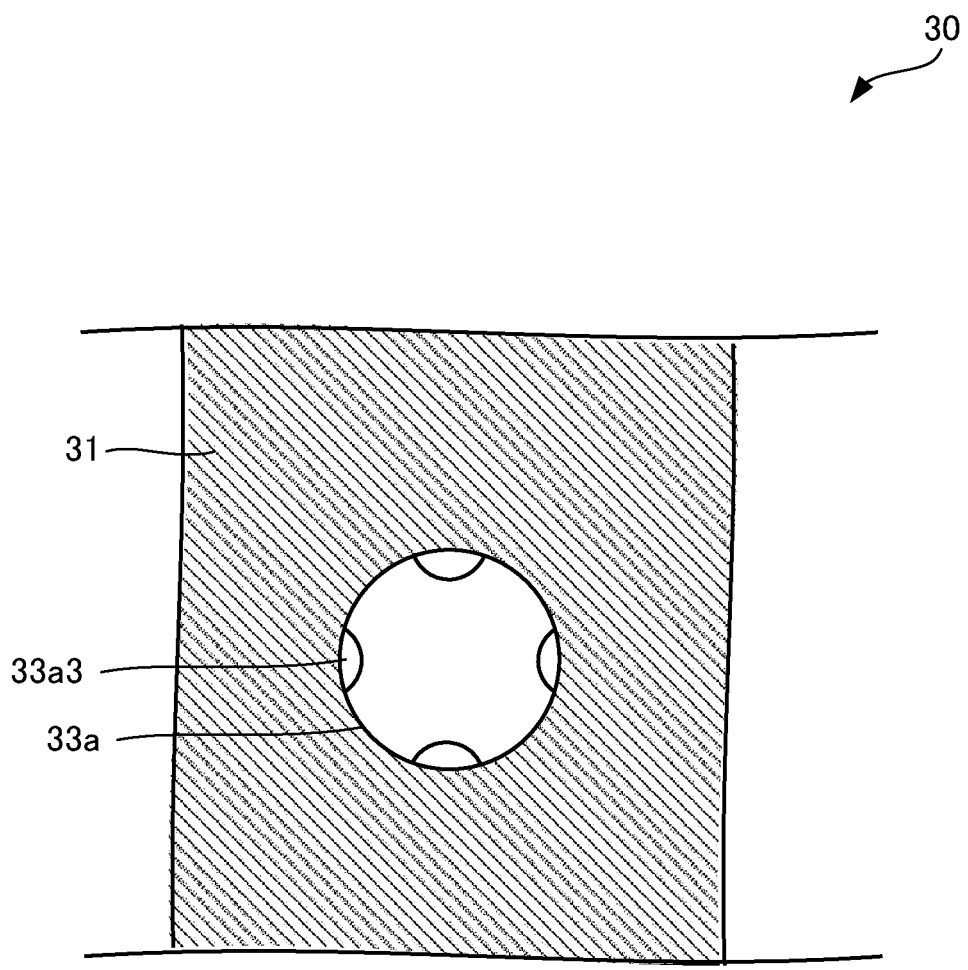
FIG. 12 is a plan view of a reference hole in a different positioning member according to the first embodiment.

The holding parts 33a1 of the reference holes 33a are only examples. The individual holding part 33a may have any other shape that enables locking with the upper groove 14a1 (or the lower groove 14a2) of the corresponding reference pin 14a. Hereinafter, a different example of the holding parts 33a1 will be described with reference to FIG. 12. FIG. 12 is a plan view of a reference hole of a different positioning member according to the first embodiment.

As illustrated in FIG. 12, holding parts 33a3 are formed on the inner wall surface of a reference hole 33a of this positioning member 30. The individual holding part 33a3 is a hemispherical protrusion that is formed on the inner periphery of the inner wall surface of a reference hole 33a and that protrudes toward the center of the reference hole 33a. In this case, too, at least two holding parts 33a3 that face each other via the reference hole 33a are formed to hold the corresponding reference pin 14a. The present embodiment illustrates a case in which four holding parts 33a3 are formed along the open edge of the individual reference hole 33a. Three holding parts 33a3 may alternatively be formed at equal intervals along the inner periphery of the inner wall surface of the individual reference hole 33a. For example, the holding parts 33a3 illustrated in FIG. 12 may be formed by cutting the inner wall surface of the reference hole 33a.

Figure 13:
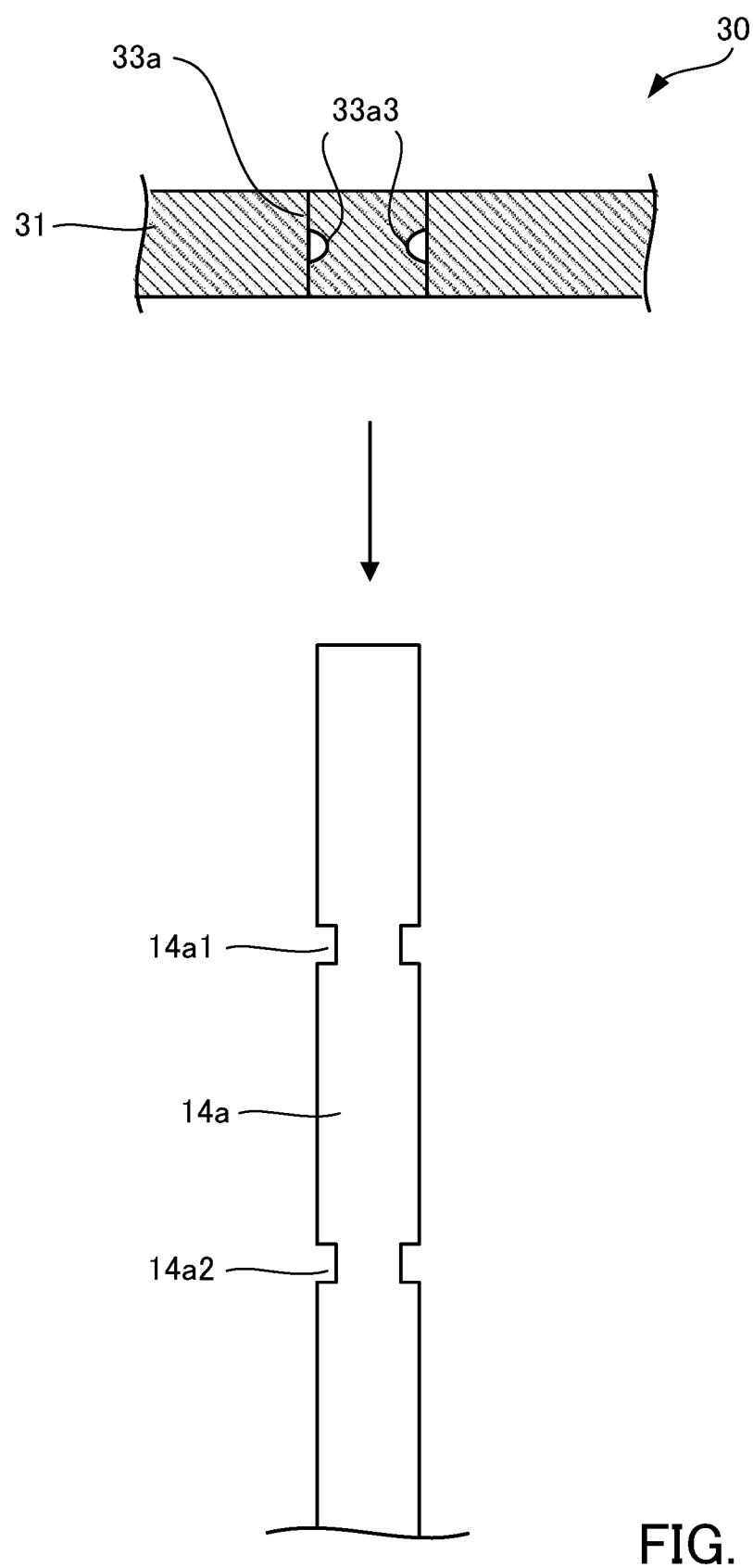
FIG. 13 is a first diagram illustrating a different attachment step of the semiconductor device manufacturing method according to the first embodiment.
Figure 14:
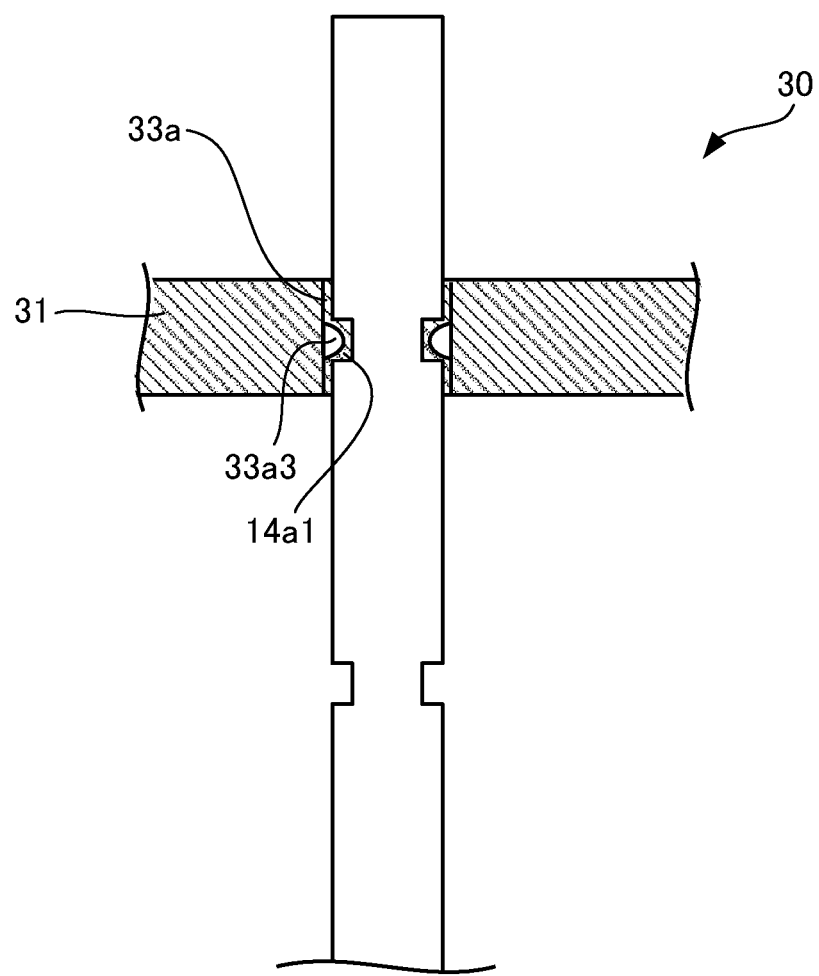
FIG. 14 is a second diagram illustrating the different attachment step of the semiconductor device manufacturing method according to the first embodiment.

The effects of the holding parts 33a3 in the different example in the step of attaching the positioning member 30 to the semiconductor module 10 will be described with reference to FIGS. 13 and 14. FIGS. 13 and 14 illustrate a different attachment step of the semiconductor device manufacturing method according to the first embodiment. First, the rear surface of the positioning member 30 is moved to face the front surface of the semiconductor module 10. In addition, the supporting holes 32 of the positioning member 30 are positioned with respect to the control terminals 13 of the semiconductor module 10, and the reference holes 33a of the positioning member 30 are positioned with respect to the reference pins 14a of the semiconductor module 10. Next, the positioning member 30 is moved toward the front surface of the semiconductor module 10. Accordingly, the control terminals 13 are inserted into the supporting holes 32, and the reference pins 14a come close to the reference holes 33a (FIG. 13). As illustrated in FIG. 14, the individual reference pin 14a is inserted into the corresponding reference hole 33a, and the holding parts 33a3 are fitted with the upper groove 14a1 of the corresponding reference pin 14a. Thus, the positioning member 30 is maintained at the locations of the upper grooves 14a1 of the reference pins 14a.

Next, a heating step of heating the semiconductor module 10, to which the positioning member 30 has been attached, is performed (step S12 in FIG. 3). This heating cures the adhesive that bonds the case 11 and the ceramic circuit board, and as a result, the ceramic circuit board is bonded to the case 11. In this heating step, after the adhesive is cured by heating, the heating is stopped to cool the semiconductor module 10. This temperature change causes warpage in the ceramic circuit board included in the semiconductor module 10 due to the difference in thermal expansion coefficient among the insulating plate, the metal plate, and the circuit patterns. In addition, the sealing material 15, which seals the open storage part 11a of the case 11, cures and contracts. The semiconductor module 10 is deformed by these deformations. However, the positioning member 30 has been attached to the control terminals 13 and the reference pins 14a of the semiconductor module 10. Even when the semiconductor module 10 is deformed, the misalignment of the control terminals 13 and the reference pins 14a is corrected to their original proper locations by the positioning member 30. In this way, the positioning member 30 is used to correct the misalignment of the control terminals 13, which is caused by deformation of the semiconductor module 10 due to temperature change. Thus, step S11 in FIG. 3 needs to be performed before a step that involves temperature change on the semiconductor module 10 is performed. This step that involves temperature change is not limited to a step of curing the adhesive. Examples of the step include filing the case 11 with sealing resin and curing the sealing resin and performing a test on electrical characteristics under temperature change.

Figure 15:
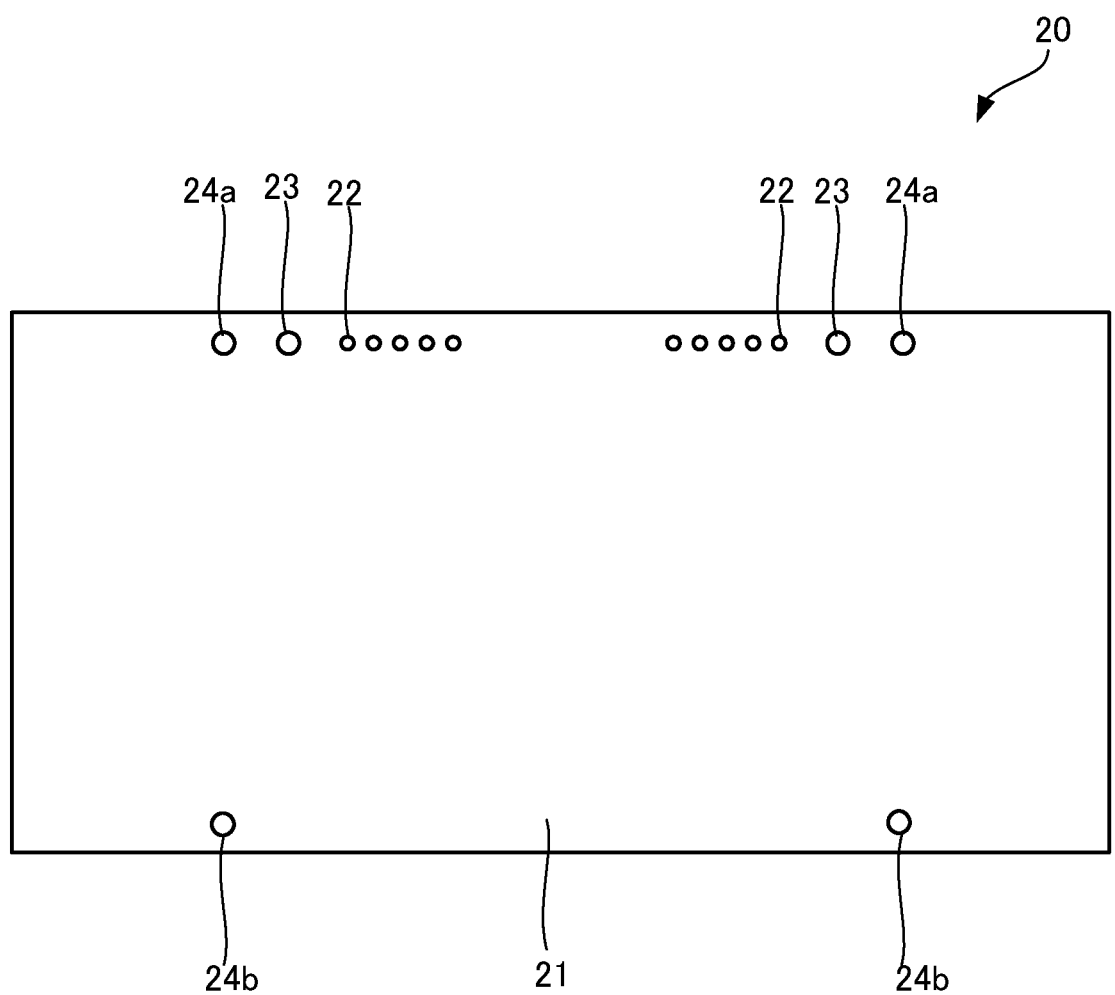
FIG. 15 is a plan view of a printed board according to the first embodiment.

Next, a mounting step of mounting the printed board 20 on the control terminals 13 of the semiconductor module 10 is performed (step S13 in FIG. 3). There are cases in which the semiconductor module 10 to which the positioning member 30 has been attached is shipped to a shipping destination after step S12. That is, there are cases in which step S13 of mounting the printed board 20 is performed at the shipping destination. The positioning member 30 protects the semiconductor module 10 from the vibration and impact from the outside during shipping. The printed board 20 may be prepared at the shipping destination. Next, the printed board 20 will be described with reference to FIG. 15. FIG. 15 is a plan view of the printed board according to the first embodiment. The printed board 20 includes an insulating plate 21 and a plurality of upper circuit patterns (not illustrated) formed on the front surface of the insulating plate 21. The printed board 20 may include a plurality of lower circuit patterns on the rear surface of the insulating plate 21, as needed.

Figure 16:
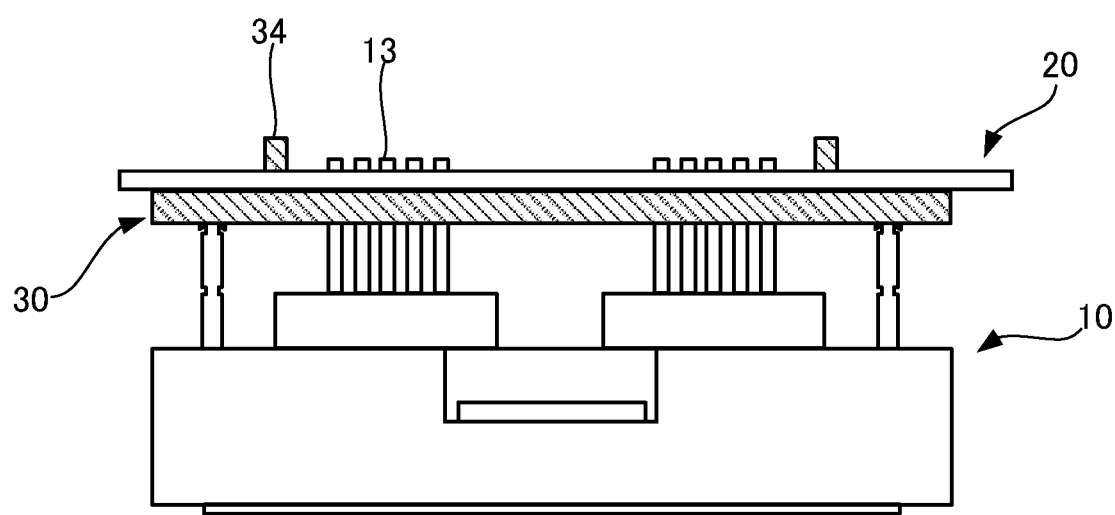
FIG. 16 illustrates a mounting step of the semiconductor device manufacturing method according to the first embodiment.

The printed board 20 has the terminal holes 22, positioning holes 23, and reference pin holes 24a and 24b. The terminal holes 22 are formed at locations that correspond to the locations of the control terminals 13 of the semiconductor module 10. In addition, the number of terminal holes 22 is the same as the number of control terminals 13. The plurality of terminal holes 22 may be disposed linearly, in a zigzag pattern, or in two lines, to correspond to the arrangement of the control terminals 13. When the control terminals 13 are inserted into the terminal holes 22 and soldered, the control terminals 13 are electrically connected to the printed board 20. The positioning holes 23 are formed at locations that correspond to the locations of the positioning elements 34 of the positioning member 30. The reference pin holes 24a are formed at locations that correspond to the locations of the reference pins 14a of the semiconductor module 10. The reference pin holes 24b are formed at locations that correspond to the locations of the reference pins 14b of the semiconductor module 10. The printed board 20 is mounted on the positioning member 30 by inserting the control terminals 13, the positioning elements 34, and the reference pins 14a and 14b into their respective holes (FIG. 16).

The upper ends of the positioning elements 34 of the positioning member 30 are located higher than the upper ends of the control terminals 13 and the reference pins 14a and 14b. Thus, the positioning elements 34 serve as the guides for mounting the printed board 20 on the positioning member 30. In this way, when the printed board has been mounted on the positioning member 30, the upper ends of the positioning elements 34 protrude from the positioning holes 23 of the printed board 20. In this case, the upper ends of the reference pins 14a do not need to pass through the reference hole 33a of the positioning member 30.

Next, a pressing step of pressing the printed board 20 mounted on the semiconductor module 10 via the positioning member 30 toward the semiconductor module 10 is performed (step S14 in FIG. 3). FIG. 16 illustrates a mounting step of the semiconductor device manufacturing method according to the first embodiment. By pressing the printed board 20 illustrated in FIG. 16 toward the front surface of the semiconductor module 10, the holding parts 33a1 of the positioning member 30 move beyond the upper grooves 14a1 of the reference pins 14a. As a result, the printed board 20 is moved toward the front surface of the semiconductor module 10. Accordingly, the reference pin holes 24b of the printed board 20 on which the positioning member 30 is not disposed is moved toward the front surface of the semiconductor module 10. In addition, since the holding parts 33a1 of the positioning member 30 are locked with the lower grooves 14a2 of the reference pins 14a, the printed board 20 is maintained at the locations of the lower grooves 14a2 of the reference pins 14a. The rear surface of the positioning member 30 is maintained at a height h2 from the front surface of the case 11 (see FIG. 2). In this way, the semiconductor device 1 illustrated in FIGS. 1 and 2 is obtained.

The above semiconductor device 1 includes the semiconductor module 10, the positioning member 30, and the printed board 20. The semiconductor module 10 includes semiconductor chips, the plurality of control terminals 13 electrically connected to the semiconductor chips, and the case 11. The case 11 holds the semiconductor chips, has a front surface from which the plurality of control terminals 13 extend upward, and includes the reference pins 14a extending upward from the front surface. The control terminals 13 and the reference pins 14a may be formed in a vertical direction on the front surface of the case 11. The positioning member 30 has the reference holes 33a that pass through a front surface and a rear surface, which is opposite to the front surface and faces the front surface of the semiconductor module 10. The reference pins 14a are inserted into the reference holes 33a. The positioning member 30 also has the plurality of supporting holes 32 which pass through the front surface and the rear surface and into which the plurality of control terminals 13 are inserted. The printed board 20 has the plurality of terminal holes 22 corresponding to the plurality of control terminals 13. The printed board 20 is disposed on the front surface of the semiconductor module 10 via the positioning member 30, and the plurality of control terminals 13 are inserted into the plurality of terminal holes 22. Since the semiconductor device 1 includes the positioning member 30, even if the manufacturing method of the semiconductor device 1 includes a heating step, the arrangement of the control terminals 13 is maintained. Thus, misalignment of the control terminals 13 is prevented. Therefore, the printed board 20 is appropriately attached to the control terminals 13. In addition, since misalignment of the control terminals 13 of the semiconductor module 10 is corrected by the positioning member 30, for example, it is possible to bring a probe pin to come into contact with the control terminals 13 from above the front surface of the semiconductor module 10 without fail before the printed board 20 is attached. Thus, electrical tests are appropriately performed on the semiconductor module 10.

Second Embodiment

Figure 17:
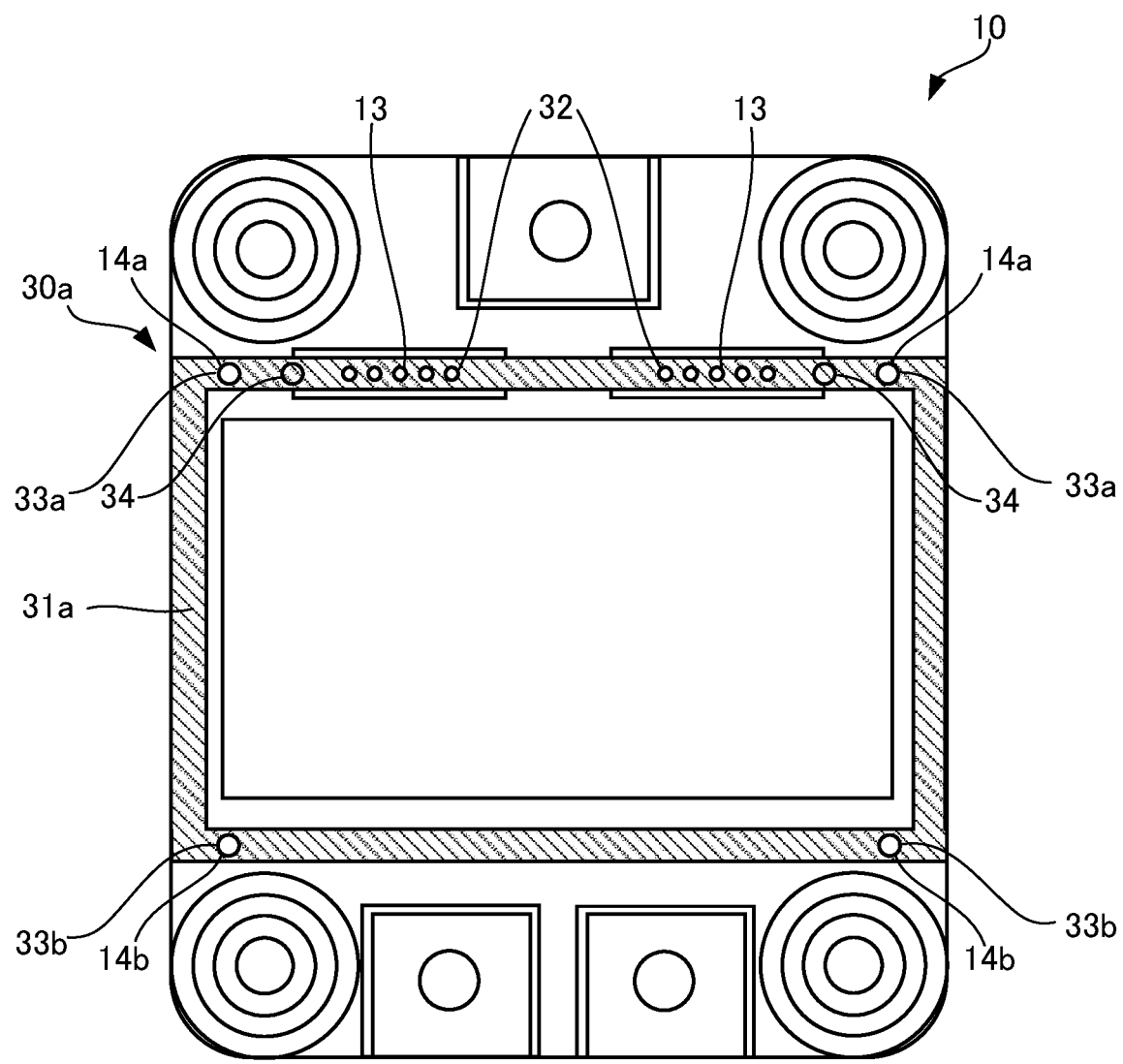
FIG. 17 is a plan view of a semiconductor module to which a positioning member according to a second embodiment has been attached.
Figure 18:
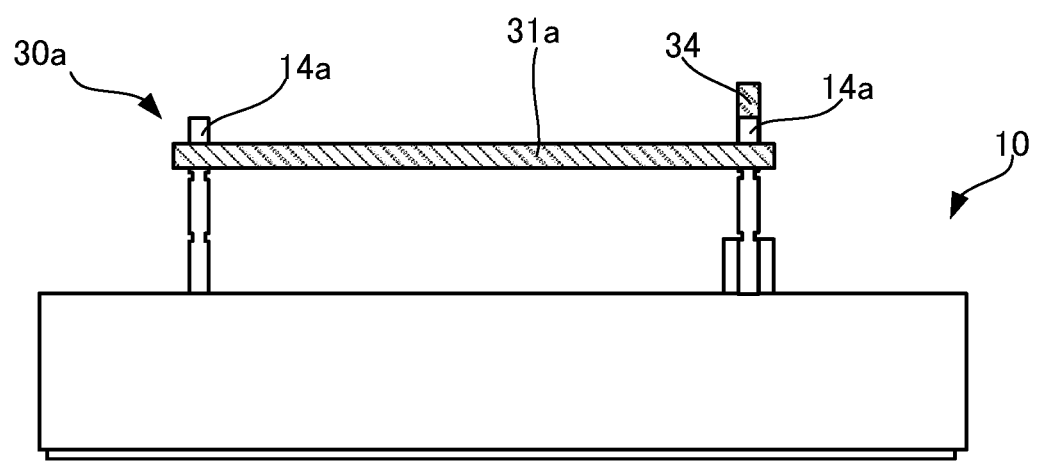
FIG. 18 is a side view of the semiconductor module to which the positioning member according to the second embodiment has been attached.

In a second embodiment, a different positioning member will be described with reference to FIGS. 17 and 18. FIG. 17 is a plan view of a semiconductor module to which a positioning member according to a second embodiment has been attached. FIG. 18 is a side view of the semiconductor module to which the positioning member according to the second embodiment has been attached. FIG. 18 is a side view seen from the right side in FIG. 17. This semiconductor module 10 according to the second embodiment is the same as that according to the first embodiment.

As illustrated in FIGS. 17 and 18, this positioning member 30a according to the second embodiment includes a supporting part 31a and positioning elements 34. The supporting part 31a has a prismatic shape and has a frame shape in a planar view. For example, the supporting part 31a has a shape running along the outer periphery of the open storage part 11a of the semiconductor module 10. The supporting part 31a is located above a plurality of control terminals 13 and reference pins 14a and 14b of the semiconductor module 10. In the present embodiment, since the plurality of control terminals 13 and the reference pins 14a are disposed linearly and the reference pins 14b are disposed linearly, the supporting part 31a has a frame shape whose linear parts connected to each other. Thus, the supporting part 31a may have a different shape other than the frame shape, depending on the arrangement of the plurality of control terminals 13 and the reference pins 14a and 14b. For example, the supporting part 31a may have a flat plate shape. In addition, the supporting part 31a has a plurality of supporting holes 32 and reference holes 33a and 33b. The plurality of supporting holes 32 are formed at locations that correspond to the locations of the plurality of control terminals 13 of the semiconductor module 10. Each of the plurality of supporting holes 32 has a diameter large enough to accommodate a control terminal 13. In addition, each of the plurality of supporting holes 32 may have a tapered part at the opening (a lower side in FIG. 7) into which a control terminal 13 is inserted. In this way, the plurality of control terminals 13 are easily inserted into the plurality of supporting holes 32.

The reference hole 33a are formed at locations that correspond to the locations of the reference pins 14a of the semiconductor module 10. Each of the reference holes 33a has a diameter large enough to accommodate a reference pin 14a. The individual reference hole 33a has the same holding parts 33a1 as those according to the first embodiment for holding a reference pin 14a. The reference holes 33b are formed at locations that correspond to the locations of the reference pins 14b of the semiconductor module 10. Each of the reference hole 33b has a diameter large enough to accommodate a reference pin 14b. The individual reference hole 33b may have the same holding parts 33a1 as those according to the first embodiment for holding a reference pin 14b. In this case, the individual reference pins 14b each have an upper groove 14a1 and a lower groove 14a2, as is the case with the reference pins 14a.

The manufacturing method of the semiconductor device 1 according to the first embodiment is performed in accordance with the flowchart in FIG. 3 by using this positioning member 30a. The present case assumes that the individual reference pin 14b also has the upper groove 14a1 and the lower groove 14a2 and that the individual reference hole 33b of the positioning member 30 has the same holding parts (not illustrated) as those of the individual reference hole 33a. In this case, in step S11 in FIG. 3, first, the rear surface of the positioning member 30a is set to face the front surface of the semiconductor module 10. In addition, the supporting holes 32 of the positioning member 30a are positioned with respect to the control terminals 13 of the semiconductor module 10, and the reference holes 33a and 33b of the positioning member 30a are positioned with respect to the reference pins 14a and 14b of the semiconductor module 10. Next, the positioning member 30a is moved toward the front surface of the semiconductor module 10. Accordingly, the control terminals 13 come close to the supporting holes 32, and the reference pins 14a and 14b come close to the reference holes 33a and 33b. The reference holes 33a are inserted into the reference pins 14a, and the hooks 33a2 of the holding parts 33a1 are locked with the upper grooves 14a1 of the reference pins 14a (see FIG. 11). The hooks 33a2 face their respective reference holes 33a. The same applies to the reference pins 14b in the reference holes 33b. Thus, the positioning member 30a is maintained at the locations of the upper grooves 14a1 of the reference pins 14a and 14b (see FIG. 18). Since the positioning member 30a has a frame shape, a total of four reference holes 33a and 33b are formed. That is, the positioning member 30a has the reference holes 33a and 33b not only horizontally but also vertically. Thus, use of the positioning member 30a makes it easier to perform the positioning than use of the positioning member 30 according to the first embodiment. While a total of four reference holes 33a and 33b are used in the above case to make it easier to perform the positioning, use of at least three reference holes 33a and 33b makes it easier to perform the positioning than use of the positioning member 30 according to the first embodiment.

Next, in step S12 in FIG. 3, a heating step of heating the semiconductor module 10 to which the positioning member 30a has been attached is performed. As described above, while this heating step deforms the semiconductor module 10, the positioning member 30a corrects misalignment of the control terminals 13, which is caused by deformation of the semiconductor module 10 due to temperature change. In particular, since the positioning member 30a has a frame shape, the positioning member 30a has better strength than that of the positioning member 30 according to the first embodiment. Thus, the positioning member 30a corrects the misalignment of the control terminals 13 caused by deformation of the semiconductor module 10 more securely than the positioning member 30 according to the first embodiment.

Next, before step S13 in FIG. 3, as described above, the semiconductor module 10 to which the positioning member 30a has been attached is shipped. In this case, since the positioning member 30a has already been attached to the semiconductor module 10 being shipped, the semiconductor module 10 is protected more securely from the vibration and impact from the outside than the semiconductor module 10 according to the first embodiment. Steps S13 and S14 in FIG. 3 are performed in the same way as those according to the first embodiment.

With the semiconductor device 1 having the semiconductor module 10, the printed board 20, and the positioning member 30a manufactured as described above, the positioning member 30a maintains the clearance between the semiconductor module 10 and the printed board 20 more uniformly than the positioning member 30. Thus, it is possible to prevent the printed board 20, in particular, the parts and terminals of the printed board 20 that face the semiconductor module 10, from coming into contact with the semiconductor module 10. In addition, it is possible to maintain a certain spatial distance between the semiconductor module 10 and the printed board 20. Thus, the insulation between the semiconductor module 10 and the printed board 20 is maintained. The positioning member 30a may have a different shape other than a frame shape. For example, the positioning member 30a may have a frame shape with beams as needed (for example, a houndstooth pattern or a checkerboard pattern). In this way, the positioning member 30a achieves even better strength. Alternatively, in addition to the positioning member 30, a positioning member corresponding to the reference pins 14b may be provided. Use of two positioning members archives the same effects as those provided by use of the positioning member 30a, while the strength and ease of positioning are not as good as those of the positioning member 30a.

According to the embodiments discussed above, there are provided a semiconductor device and a manufacturing method thereof that prevent misalignment of external terminals and that achieve easy and secure attachment of a printed board to the external terminals.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor module, including
a semiconductor chip,
a case which stores the semiconductor chip, the case having a front surface,
a plurality of external terminals which are electrically connected to the semiconductor chip and extend upward from the front surface of the case, and
a reference pin which extends upward from the front surface of the case;
a positioning member having a front surface and a rear surface thereof that are opposite to each other, the rear surface facing the front surface of the case, the positioning member including
a reference hole penetrating therethrough to accommodate the reference pin of the semiconductor module, and
a plurality of supporting holes formed therein to respectively accommodate the plurality of external terminals of the semiconductor module; and
a printed board including a plurality of terminal holes that respectively correspond to the plurality of external terminals, the printed board being disposed on the front surface of the case via the positioning member, the plurality of external terminals of the semiconductor module being respectively attached to the plurality of terminal holes.

2. The semiconductor device according to claim 1, wherein the reference hole has a holding part configured to hold the reference pin, such that the rear surface of the positioning member is maintained at a predetermined height from the front surface of the case.

3. The semiconductor device according to claim 2,
wherein the positioning member has a positioning element on the front surface thereof, the positioning element having an upper end that is lower than upper ends of the plurality of external terminals, and
wherein the printed board has an insertion hole into which the positioning element is inserted.

4. The semiconductor device according to claim 1, wherein in a plan view of the semiconductor device, the plurality of external terminals are aligned, and the plurality of supporting holes are aligned.

5. The semiconductor device according to claim 4, wherein in the plan view of the semiconductor device, the reference pin and the plurality of external terminals are aligned, and the reference hole and the plurality of supporting holes are aligned.

6. The semiconductor device according to claim 1, wherein the positioning member is made of glass, ceramic, or a resin material.

7. A semiconductor device manufacturing method comprising:
preparing a semiconductor module including
a semiconductor chip,
a case which stores the semiconductor chip, the case having a front surface,
a plurality of external terminals electrically connected to the semiconductor chip, and extending upward from the front surface of the case, and
a reference pin extending upward from the front surface of the case, and
a positioning member having a reference hole and a plurality of supporting holes penetrating therethrough, the positioning member having a front surface and a rear surface opposite to each other;
attaching the positioning member to the semiconductor module by
setting the rear surface of the positioning member to face the front surface of the case, and
inserting the reference pin and the plurality of external terminals respectively into the reference hole and the plurality of supporting holes, such that the reference pin is held in the reference hole, and the rear surface of the positioning member is maintained at a first height from the front surface of the case;
heating the semiconductor module to which the positioning member has been attached;
separately preparing a printed board having a plurality of terminal holes that respectively correspond to the plurality of external terminals;
mounting the printed board on the front surface of the positioning member, and inserting the plurality of external terminals, extending from the front surface of the positioning member, into the plurality of terminal holes in the printed board; and
pressing the printed board toward the front surface of the case to attach the printed board to the plurality of external terminals.

8. The semiconductor device manufacturing method according to claim 7,
wherein the positioning member has a positioning element on the front surface thereof, and
wherein, the attaching includes attaching the positioning member to the semiconductor module such that an upper end of the positioning element is higher than upper ends of the plurality of external terminals.

9. The semiconductor device manufacturing method according to claim 8, wherein the attaching includes
maintaining the positioning member at the first height, and
maintaining a length of each of the external terminals between the rear surface of the positioning member and the front surface of the case to be at least one third of an entire length of said each external terminal.

10. The semiconductor device manufacturing method according to claim 7, wherein the pressing includes moving the positioning member and the printed board toward the front surface of the case and allowing the reference hole to hold the reference pin at a second height, which is lower than the first height, from the front surface of the case, such that the positioning member is maintained at the second height.

* * * * *